United States Patent [19]
Zhao et al.

[11] Patent Number: 5,885,356
[45] Date of Patent: Mar. 23, 1999

[54] METHOD OF REDUCING RESIDUE ACCUMULATION IN CVD CHAMBER USING CERAMIC LINING

[75] Inventors: Jun Zhao, Cupertino; Tom Cho, San Francisco; Xin Sheng Guo, Los Altos Hills, all of Calif.; Atsushi Tabata, Narita, Japan; Jianmin Qiao, Fremont; Alex Schreiber, Santa Clara, both of Calif.

[73] Assignee: Applied Materials, Inc., Santa Clara, Calif.

[21] Appl. No.: 577,862

[22] Filed: Dec. 22, 1995

Related U.S. Application Data

[63] Continuation-in-part of Ser. No. 348,273, Nov. 30, 1994, Pat. No. 5,558,717.

[51] Int. Cl.$^6$ .............................. C23C 16/00; B44C 1/22
[52] U.S. Cl. ........................... 118/723 ER; 118/723 ME; 118/723 MW; 118/715; 118/719; 118/720; 118/725; 118/728; 156/345; 156/625.1; 156/643.1; 156/646.1
[58] Field of Search ..................... 118/723 ER, 723 ME, 118/723 MW, 715, 719, 720, 725, 728; 156/345, 625.1, 643.1, 646.1

[56] References Cited

U.S. PATENT DOCUMENTS

| | | | |
|---|---|---|---|
| 4,820,377 | 4/1989 | Davis et al. | 156/643 |
| 4,960,488 | 10/1990 | Law et al. | 156/643 |
| 5,129,958 | 7/1992 | Nagashima et al. | 134/22.1 |
| 5,158,644 | 10/1992 | Cheung et al. | 156/643 |
| 5,269,881 | 12/1993 | Sekiya et al. | 156/643 |
| 5,304,279 | 4/1994 | Coultas et al. | 156/345 |
| 5,318,632 | 6/1994 | Onodera | 118/715 |
| 5,366,585 | 11/1994 | Robertson et al. | 156/345 |
| 5,556,476 | 9/1996 | Lei et al. | 118/728 |
| 5,556,479 | 9/1996 | Bran | 134/13 |
| 5,616,208 | 4/1997 | Lee | 156/345 |

FOREIGN PATENT DOCUMENTS

| | | |
|---|---|---|
| 463 633 A1 | 6/1991 | European Pat. Off. . |
| 0463392A1 | 1/1992 | European Pat. Off. . |
| 0619381A1 | 10/1994 | European Pat. Off. . |
| 0625589A1 | 11/1994 | European Pat. Off. . |
| 4330266A1 | 3/1994 | Germany . |
| 59-023520 | 7/1984 | Japan . |
| 3240960 | 1/1992 | Japan . |
| 05055184 | 5/1993 | Japan . |
| 5006800 | 5/1993 | Japan . |
| WO90/13687 | 11/1990 | WIPO . |
| WO93/26038 | 12/1993 | WIPO . |

*Primary Examiner*—Cecilia J. Tsang
*Assistant Examiner*—Abdel A. Mohamed
*Attorney, Agent, or Firm*—Townsend & Townsend & Crew

[57] ABSTRACT

The present invention provides a method and apparatus for limiting residue build-up by lining with a ceramic material the exhaust plenun and exhaust manifold of a processing chamber. In another aspect of the invention, the inventors have used an air gap between the ceramic liner and the processing chamber walls to increase the dielectric value of the ceramic liner, and further inhibit the build-up of residues. In another aspect, the ceramic liner has been found to retain sufficient heat to allow the elimination of heaters typically used to heat the aluminum walls during a clean operation, if the clean operation is commenced immediately after a process step so that the ceramic retains the necessary heat from the previous processing step. The provision of an air gap aids in this heating, preventing the ceramic heat from being drawn off by direct contact with the aluminum walls. In a preferred embodiment, the ceramic liners are attached to the chamber walls with TEFLON® (polytetrafluoroethylene) screws.

22 Claims, 5 Drawing Sheets

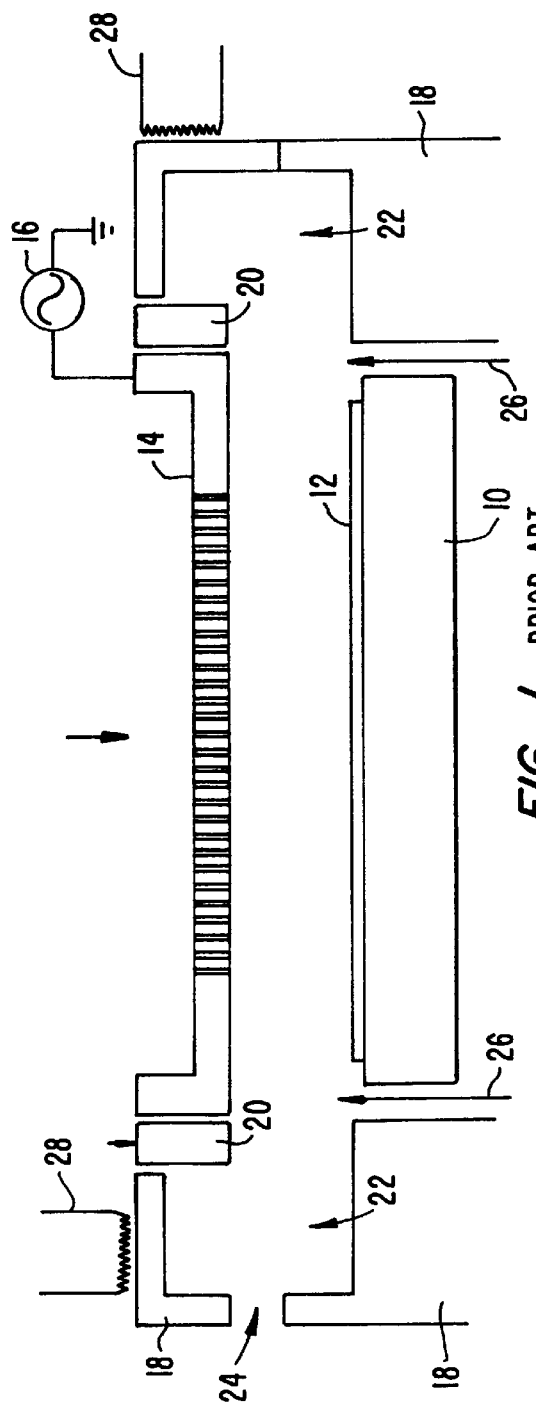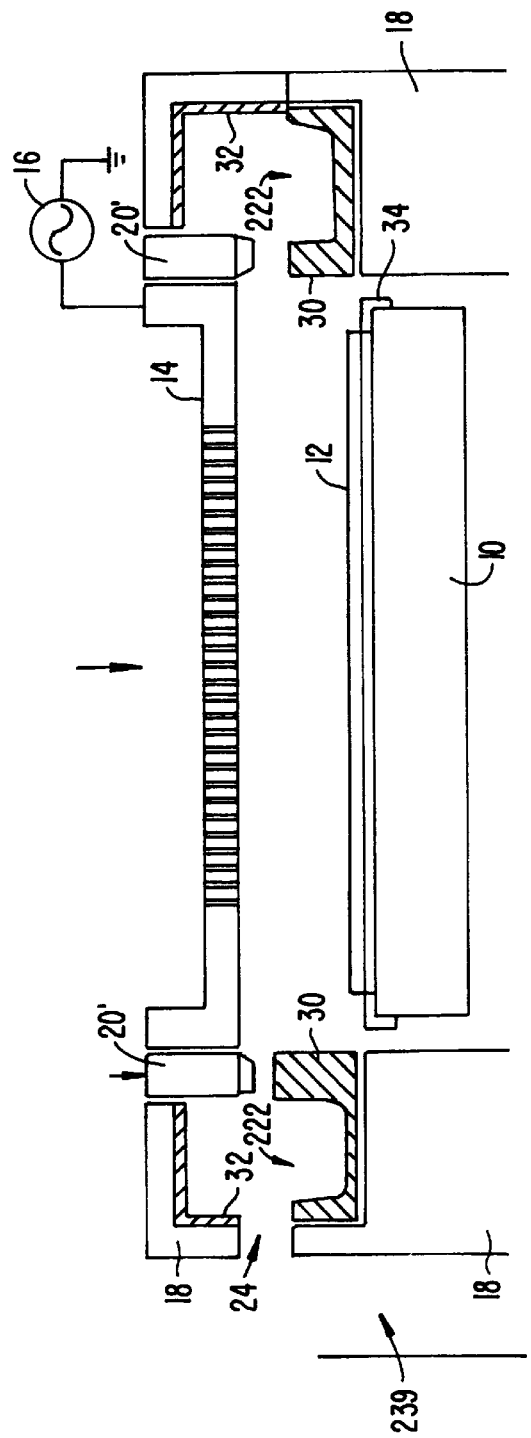

METHOD OF REDUCING RESIDUE ACCUMULATION IN CVD CHAMBER USING CERAMIC LINING

This application is a Continuation-In-Part of patent application Ser. No. 08/348,273, filed Nov. 30, 1994, now U.S. Pat. No. 5,558,717, entitled "CVD Processing Chamber".

BACKGROUND OF THE INVENTION

The present invention relates to the field of semiconductor processing equipment and more specifically to a method and apparatus for reducing residues inside a semiconductor processing chamber.

During chemical vapor deposition (CVD) processing, deposition gas molecules are deposited on the surface of a substrate. Some of these molecules also come in contact with areas of the chamber, such as the aluminum walls, resulting in the unwanted deposition of material and residues. When the build-up of surface deposits on the inside of the processing chamber becomes thick, flakes or particles of the deposited material can break off from the surface of the chamber onto the substrate being processed, potentially causing a defect. Surface deposits also adversely effect other processing conditions such as deposition uniformity, deposition rate, film strength and the like.

To avoid this problem, the inside surfaces of processing chambers are periodically cleaned to remove the material deposited by the deposition gases. Various techniques have been used or proposed for cleaning residues from interior surfaces of a processing chamber. One conventional cleaning technique involves physically cleaning the interior surfaces of the processing chamber by way of rinse water and clean wipes. A limitation with this technique is that the processing apparatus often operates no more than 1000 to 2000 runs before substantial residues build up on its interior surfaces. To remove these deposits with a rinse water and clean wipe requires that the processing apparatus be taken down to clean its interior surfaces. A further limitation is that this conventional cleaning process often takes several hours or more to perform. Taking a machine down for hours at a time clearly impacts wafer throughput in the fabrication plant.

Another technique suggests the use of etching gases, such as fluorine, for removing deposited material and residues from the chamber walls in a plasma process. Detailed descriptions may be found, for instance, in U.S. Pat. No. 4,960,488, U.S. Pat. No. 5,124,958 and U.S. Pat. No. 5,158,644. The plasma enhanced etching gases can be used periodically after a group of N wafers has been processed or after every wafer. The etching gases react with the deposited material so as to remove it from the surfaces of the processing chamber. Such techniques, however, often cannot remove all the aluminum and organic residues from the chamber walls without other detrimental effects. In fact, the etchant gases can increase the amount of particles into the processing chamber from precipitates derived from the etching gases and the like. Examples of precipitates include aluminum oxide, aluminum fluoride, aluminum oxyfluoride, and others. The precipitates increase the particle count in the processing chamber, which is clearly an undesirable result. Moreover, the use of such etchant gases in a clean step requires additional processing time thereby decreasing wafer throughput.

The physical cleaning techniques described above are often used in conjunction with etching gases to periodically clean the residues and precipitates which remain after a chamber clean. However, as described above, the physical clean process results in further down time of the processing machine and lower wafer throughput.

Thus, it is desirable to keep processing chambers clean and substantially free from particles to prevent contaminating semiconductor integrated circuits being processed and to minimize down or cleaning time so as to increase wafer throughput as much as possible. From the above it is seen that an apparatus for processing semiconductor wafers that requires less periodic cleaning is desirable.

One approach to eliminate residues left over from a chamber clean has been utilized in a plasma enhanced chemical vapor deposition (PECVD) silicon nitride processing chamber as shown in cross section in FIG. 1. The chamber is cylindrical in shape. The chamber includes a heated pedestal 10 for supporting a substrate or wafer 12 for processing and a shower head 14 for dispersing process gases above the wafer under plasma conditions. The plasma is formed between shower head 14 and substrate 12 by using an RF source 16 to apply a potential to the shower head, with the pedestal 10 being grounded. In addition, chamber walls 18 are also grounded. The chamber walls are insulated from the voltage applied to the shower head by RF insulators 20. Since this is a cross section, RF insulator 20 is a ring around the circular shower head 14.

The process gases are applied through shower head 14 to wafer 12. An exhaust channel 22 is formed in the chamber wall, as an annular ring. At one point, there is a port 24 connected to a vacuum pump to draw out the exhaust gases.

In one example, a plasma enhanced CVD film of silicon nitride is deposited on wafer 12 using a recipe requiring silane, $N_2O$ and ammonia or a similar recipe. The deposited nitride film forms on the surface of wafer 12. Unfortunately, films can also deposit on the chamber itself, forming an undesirable residue which could contaminate subsequent process steps. The primary area of deposits are on the chamber walls adjacent the exhaust channel 22. Because gas is being forced through the gas distribution manifold, less of the reactant will form on the gas distribution manifold itself, since it is directed away by the incoming gas. In addition, the gas distribution manifold is hotter than other parts of the chamber, since it is in contact with generated plasma, and the heat reduces residue build-up. With respect to the pedestal, most of this is covered by the wafer substrate, and thus there is less formation of residue there. With respect to the lower parts of the chamber walls, in one implementation, a purge gas is forced up along the sides of pedestal 10 between it and the chamber walls 18 along a path 26. The purpose of the purge gas is to avoid deposits at undesirable locations and prevent deposits on the wafer edges. Accordingly, this is one method of protecting the lower parts of the chamber wall from undesirable residue buildup. Since the vacuum pump draws the exhaust gases, this is a primary area where residue will build up on the chamber walls. RF insulator 20 is not connected to ground, and thus less of the plasma forms between it and the shower head, reducing the amount of residue buildup.

An in-situ plasma clean is typically used to clean these deposits. Typically, the in-situ clean contains a fluorine species such as $CF_4$ and an oxide such as $O_2$ which are ignited under plasma conditions. The clean typically removes material deposited during the nitride deposition step, but leaves its own residue as described above. The etched away material is pumped by a pumping system, not shown, through exhaust port 24.

The residue left over from the chamber clean is made up of particles from some or all of a combination of oxygen, nitrogen, silicon, fluorine and similar elements. Heaters 28 heat walls 18 of the processing chamber during the clean step to above 100 degrees C. Such an elevated temperature deters deposition of the process and exhaust gases that may otherwise form on the chamber walls. The inclusion of heaters 28 adds to the complexity and cost of the processing chamber and requires energy during operation which further increases processing costs. Without the heater, the aluminum chamber walls are typically around 70°–80° C. due to water cooling during processing.

U.S. Pat. No. 5,366,585, assigned to the same assignee as the present application, discloses the use of a free-standing ceramic liner around portions of the chamber wall exposed to the processing plasma. The ceramic was found to act as an insulator, reducing the build-up of residue on the electrically conductive aluminum chamber walls. It was disclosed that the ceramic barrier material need not shield the entire inner surface of the process reactor chamber, but it should protect reactor chamber surfaces surrounding the area in which plasma will be generated. The liner was preferably 130 micrometers to 6.4 millimeters thick, and made of a non-porous, homogeneous material, such as ceramic alumina.

SUMMARY OF THE INVENTION

The present invention provides a method and apparatus for limiting residue build-up by lining with a ceramic material the exhaust plenun and exhaust manifold of a processing chamber. These exhaust areas attract residue formation due to the funneling of exhaust gases and particles through this area. Although not in a direct line with the plasma between the gas dispersing manifiold and the susceptor, it has been discovered by the inventors that residue build up in the exhaust areas is reduced by a ceramic liner, which need not be as thick as a ceramic liner directly exposed to such plasma.

In another aspect of the invention, the inventors have used an air gap between the ceramic liner and the processing chamber walls to increase the dielectric value of the ceramic liner, and further inhibit the build-up of residues. In another aspect, the ceramic liner has been found to retain sufficient heat to allow the elimination of heaters typically used to heat the aluminum walls during a clean operation, if the clean operation is commenced immediately after a process step so that the ceramic retains the necessary heat from the previous processing step. This both saves the time and the power required to heat the chamber and eliminates the need for the heaters. The provision of an air gap aids in this heating, preventing the ceramic heat from being drawn off by direct contact with the aluminum walls.

In a preferred embodiment, the ceramic liners are attached to the chamber walls with TEFLON® (polytetrafluoroethylene) screws. The non-metal TEFLON® screws avoid a plasma being generated between the screw and the gas discharge manifold, or shower head. In addition, the surface of the TEFLON® is less susceptible to particulate formation.

In one embodiment, a ceramic cover is also placed over the pedestal supporting the wafer in order to provide a more uniform plasma flow and to protect the pedestal from residue formation. The dielectric value of the ceramic covering on the chamber walls is chosen to be higher than the pedestal ceramic cover in order to ensure that the plasma is primarily directed to the pedestal. The different dielectric values are due to differences in material and/or thickness.

These and other embodiments of the present invention along with many of its advantages and features are described in more detail in conjunction with the text below and attached figures.

BRIEF DESCRIPTION OF THE DRAWINGS

FIG. 1 shows a vertical cross-section of a PECVD chamber according to the prior art;

FIG. 2 shows a vertical cross-section of a PECVD chamber according to one embodiment of the present invention;

DETAILED DESCRIPTION OF THE PREFERRED EMBODIMENTS

Figure 3:
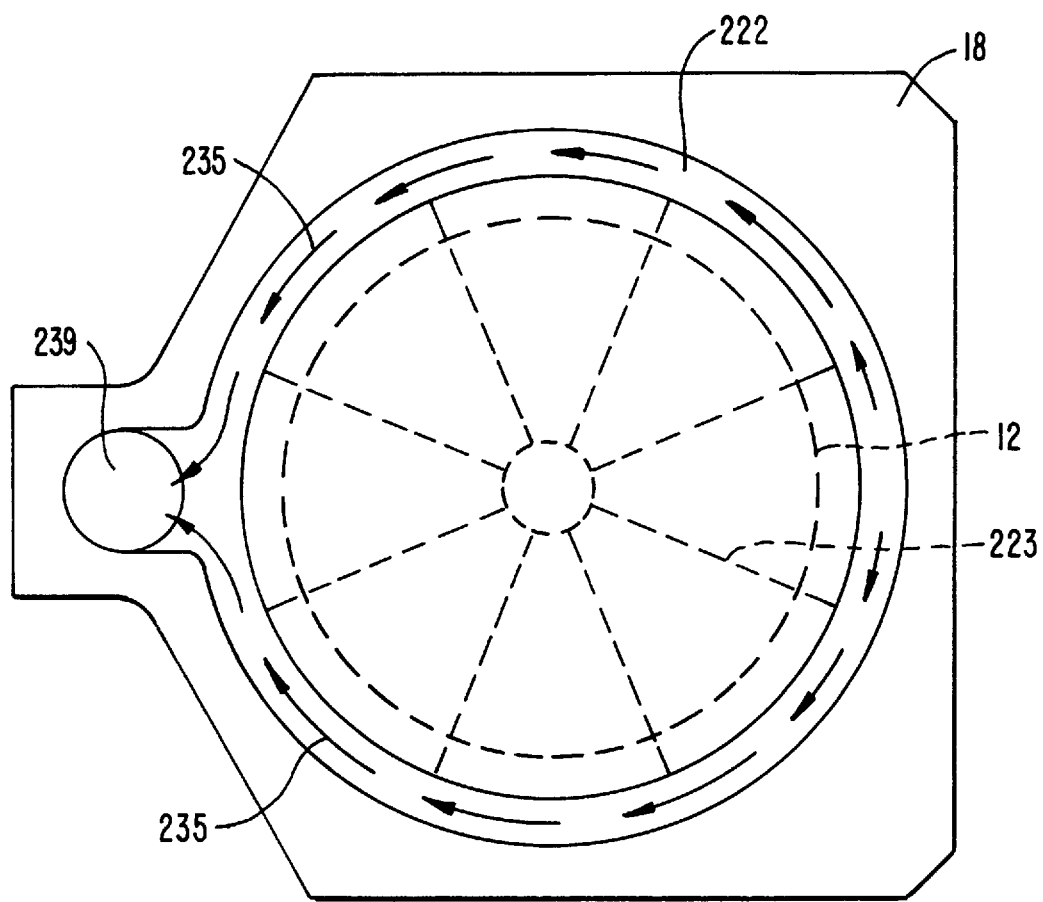
FIG. 3 shows a horizontal cross section of a PECVD chamber according to one embodiment of the present invention.

FIG. 2 shows the prior art process chamber of FIG. 1 modified in accordance with the present invention. Ceramic rings 30 and 32 have been added to the interior of the process chamber in the exhaust manifold. In addition, an RF insulator 20' of different shape has been added, extending below gas distribution manifold 14 to provide a narrower gap for the exhaust gases. In addition, a ceramic pedestal cover 34 is shown. The details of the ceramic pedestal cover and the extended RF insulator 20' are set forth in copending application Ser. No. 08/348,273, filed Nov. 30, 1994, entitled "CVD Processing Chamber", assigned to Applied Materials, Inc., the disclosure of which is hereby incorporated herein by reference. As discussed in that application, ceramic pedestal cover 34 also provides the function of adding a dielectric in between the pedestal and the gas distribution manifold to provide a more uniform plasma. The narrow gap between the RF insulator 20' and ceramic ring 30 serves to provide pressure differential for an even exhaustion of exhaust gases and thus a more even deposition of the desired material on the wafer substrate 12.

Since ceramic ring 32 is further removed from the gas distribution manifold, and is also blocked by RF insulator 20', it does not need to be as thick as RF insulator 20' or ceramic ring 30 in order to limit the plasma generated between its covered chamber wall and the gas distribution manifold. It is also desirable to keep this liner thin to maintain a large exhaust chamber. Ring 30 is carved out to form part of an exhaust plenum 222. This is to aid in the pressure differential to allow exhaust gases to be removed from the chamber, eventually exiting through downward extending exhaust gas passage 239.

FIG. 3 is a horizontal cross sectional view illustrating the gas flow in the embodiment of FIG. 2. The view looks down on wafer 12 and the annular plenum 222. As can be seen, gases are dispersed radially as indicated by arrows 223, passing through the narrow slot between RF insulator ring 20' and ceramic ring 30. These gases then enter plenum 222, and travel in a direction indicated by arrows 235 to the downward extending gas exhaust passage 239.

Figure 4:
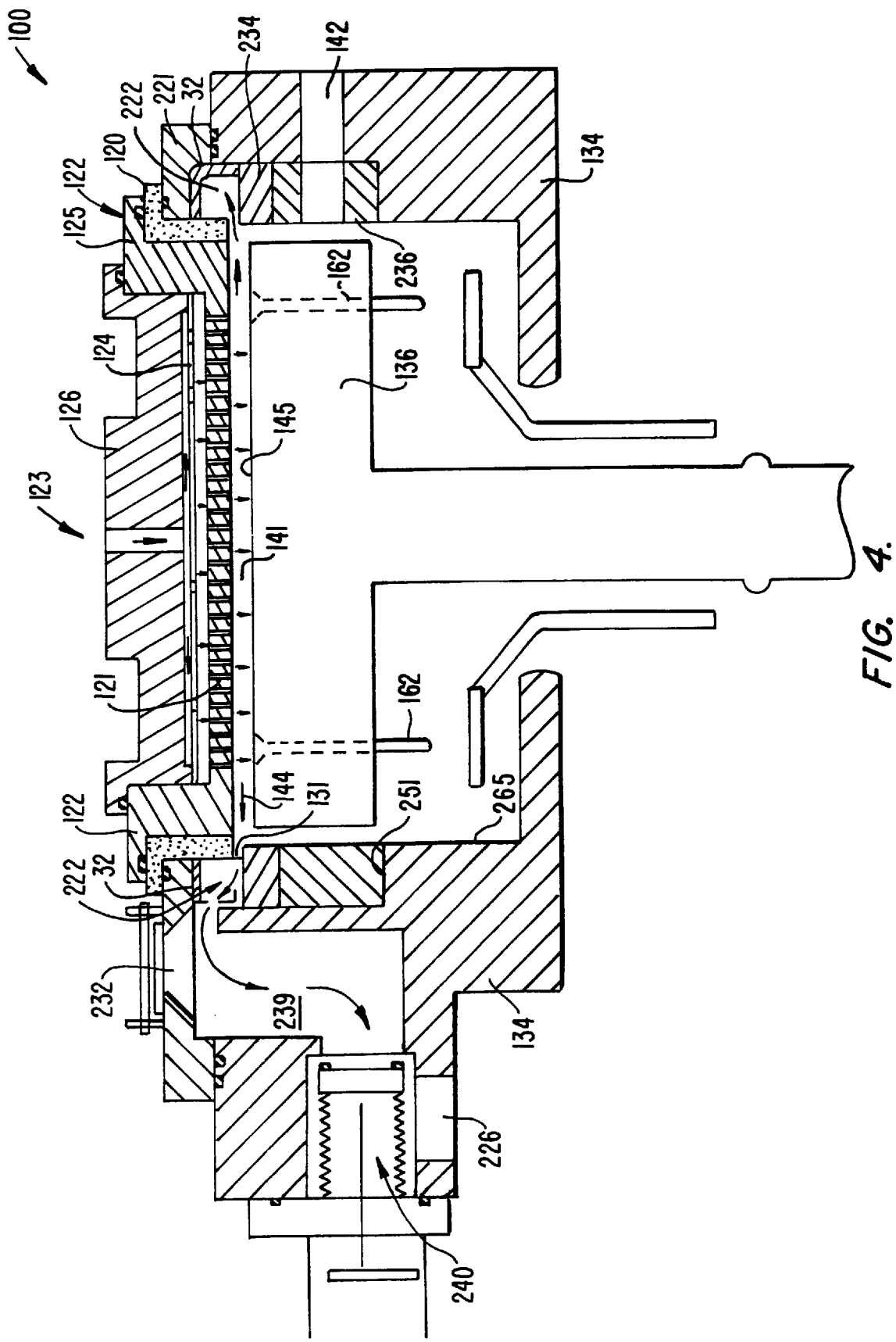
FIG. 4 shows a more detailed vertical cross section of a PECVD chamber according to one embodiment of the present invention.

An overall, more detailed cross-sectional view of an embodiment of a processing chamber 100 according to the present invention is shown in FIG. 4. A heated pedestal 136 centered within processing chamber 100 supports a semiconductor wafer or substrate (not shown) at a wafer processing location 141 on a flat (or slightly convex), circular face 145 of the pedestal. A lift mechanism (not shown) raises and lowers heated pedestal 136 and its wafer lift pins 162 as wafers are transferred into and out of the body of the chamber by a robot blade (not shown) through an insertion/removal opening 142 in the side of the chamber.

The pedestal face 145 is parallel and spaced closely to a process gas distribution faceplate 122 through which process gases enter the chamber. An RF power supply (not shown) applies electrical power between the gas distribution faceplate 122 and the pedestal so as to excite the process gas mixture to form a plasma within the cylindrical region between the faceplate and the pedestal. The constituents of the plasma react to deposit a desired film on the surface of the semiconductor wafer supported on the face 145 of the pedestal. The remainder of the gas mixture, including reaction products, is evacuated from the chamber by a vacuum pump (not shown).

The aluminum pedestal 136 and the inner surface 265 of the cylindrical side wall of the chamber are lined with a ceramic material (rings 236, 234) to avoid residue build-up. The ceramic material also resists corrosion and adjusts the degree of impedance encountered by the plasma as the RF circuit (not shown) seeks to complete its circuit to ground potential. The improved uniformity of gas distribution across the wafer and the circular configuration of the chamber 100 and its symmetrical liners (236, 234) help to make the plasma in the chamber more uniform and stable to contribute to an improvement in the uniformity of the thickness of material deposited on the wafer being processed. U.S. Pat. No. 5,366,585, the disclosure of which is hereby incorporated by reference, provides further information on the types of ceramics and their thickness and one embodiment of where they are placed.

As stated above, during a deposition process the semiconductor wafer (not shown) is supported on the face 145 of the pedestal 136. The face 145 is parallel and spaced closely to a process gas distribution faceplate 122 having holes 121 through which process gases enter the chamber. More specifically, deposition process gases flow into the chamber through an inlet manifold 126 (indicated by arrow 123), through a conventional perforated blocker plate 124, and through the holes 121 in a conventional flat, circular gas distribution faceplate 122 (indicated by small arrows 144). The elements from inlet manifold 126 to gas distribution faceplate 122 are part of a gas distributor manifold which is a part of the lid to the chamber. An RF power supply (not shown) applies electrical power between the gas distribution faceplate 121 and the pedestal so as to excite the process gas mixture to form a plasma within the cylindrical region between the faceplate and the pedestal. (This region will be referred to herein as the "reaction region".) The constituents of the plasma react to deposit a desired film on the surface of the semiconductor wafer supported on the face 145 of the pedestal. The remainder of the gas mixture, including reaction products, is evacuated from the chamber by a vacuum pump (not shown).

Specifically, the gases are exhausted through an annular, slot-shaped orifice 131 surrounding the reaction region and into an annular exhaust plenum 222. The annular slot 131 and the plenum 222 are defined by the gap between the top of the chamber's cylindrical side wall 134 (including the upper dielectric lining 234 on the wall) and the bottom of the ceramic liner 32 under circular chamber lid 221 (including the dielectric insulator (isolator) 120 between the lid 221 and the perimeter flange 125 of the gas distribution plate 121). As discussed in the above-referenced parent application, the 360° circular symmetry and uniformity of the slot orifice 131 and the plenum 222 are important to achieving a uniform flow of process gases over the wafer so as to deposit a uniform film on the wafer.

From the exhaust plenum 222, the gases flow underneath a viewing port 232, through a downward-extending gas passage 239, past a vacuum shut-off valve 240 (whose body is integrated with the lower chamber body 134), and into the exhaust outlet 226 which connects to the external vacuum pump (not shown).

Figure 5:
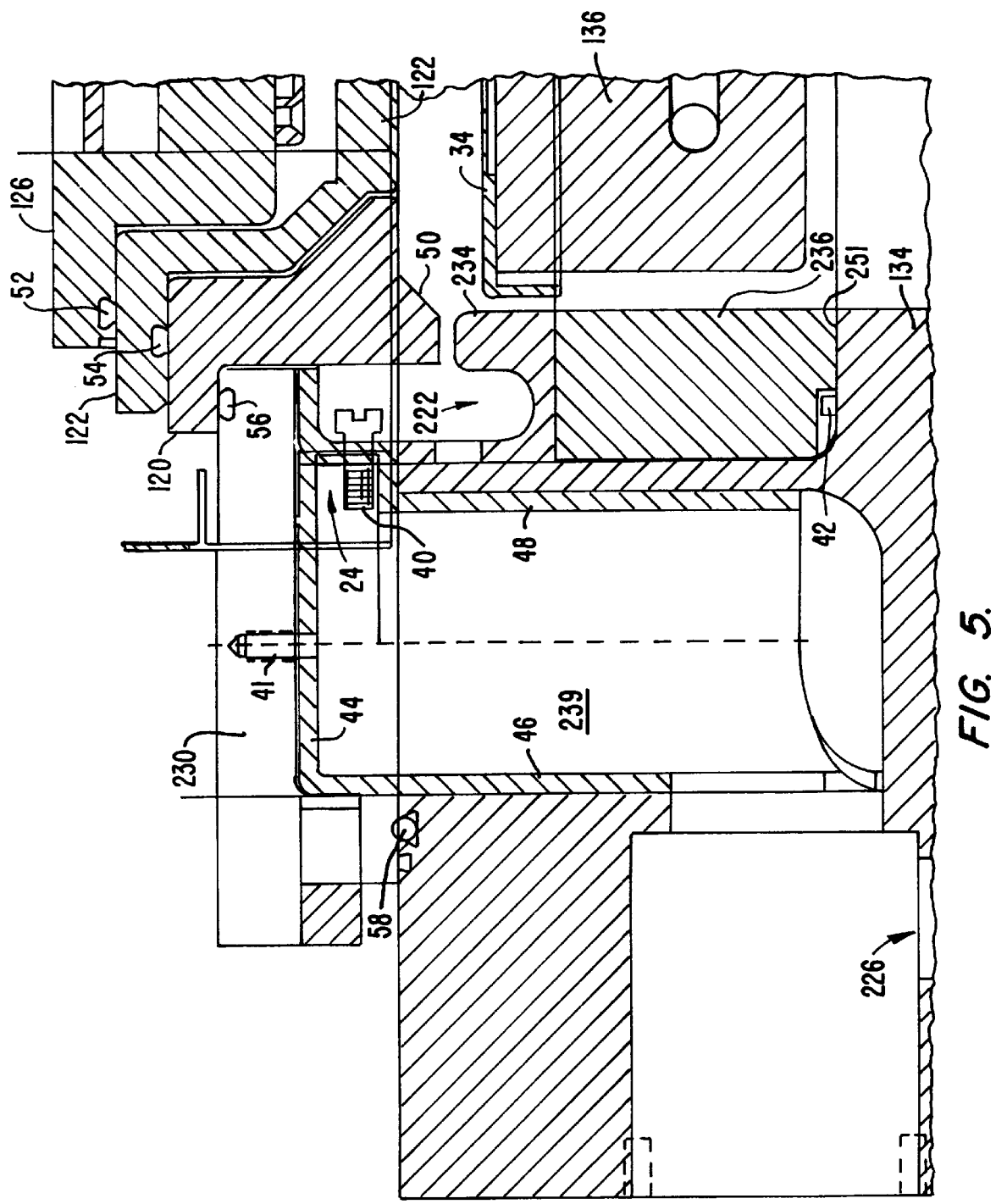
FIG. 5 shows the vertical cross section of the exhaust port of the embodiment of FIG. 4 in more detail.

In the illustrated preferred embodiment, which is designed for processing wafers of 8 inch (203.2 mm) diameter, the pedestal diameter is 10.3 inches (261.6 mm), and the inner diameter of the slot orifice 131 is 10.5 inches (267 mm). The diameter of a typical wafer support pedestal 136 with ceramic coating is 10.3 in. (261.6 mm). The inside and outside diameter of a typical chamber liner (e.g., 234, 236) are approximately 10.5 in (266.7 mm) and 12.5 in (317.5 mm), respectively. The length of the narrowest passage of the radial slot being approximately 0.5 in (12.7 mm) whose length can be adjusted by changing the relative diameters of the pieces and their overlap. The slot gap 131 can similarly be changed. A beveled surface can be provided on the bottom surface of the isolator 120 as shown in FIG. 5. The above described gap (slot) configuration 131 is useful for example when the chamber internal pressure is maintained at 4.5 torr and a gas flow of 285 sccm $SiH_4$, 140 sccm $NH_3$ and 4000 sccm $N_2$ is provided to a processing chamber operating at a temperature of approximately 400° C.

The wafer support pedestal or platen 136 is covered by a corrosion-resistant shield to protect the pedestal from corrosion by process gases, particularly during the plasma etch process used for cleaning the chamber between deposition processes. During both etching and deposition the plasma is excited by applying an RF voltage between the wafer support pedestal and the gas distribution plate 122. The shield 34 (see FIG. 2) generally is a dielectric, so it increases the electrical impedance between the plasma and the pedestal. The cover plate or shield is a ceramic (preferably aluminum nitride) disc. If the aluminum chamber side wall 134 were exposed to the plasma, it would present a lower impedance path for current from the plasma, and therefore would undesirably deflect away from the semiconductor wafer the plasma containing the deposition process reagents, thereby lowering the rate of deposition on the wafer and undesirably depositing material on the chamber walls.

This problem can be overcome by covering the interior surface of the cylindrical chamber wall with a dielectric lining which imposes an electrical impedance between the chamber wall and the plasma body which is substantially greater than the electrical impedance between the pedestal and the plasma body. A high electrical impedance can be achieved by making the dielectric liner on the wall much thicker than the shield disc on the pedestal, and, optionally, by also choosing for the wall liner a material having a lower dielectric constant than the material of the shield disc.

In our deposition chamber, the inside of the chamber wall is covered by upper and lower annular dielectric liners 234 and 236 (although a single liner could be used. The upper liner rests on the lower liner, which rests on a shelf 251 on the chamber wall. Additionally, the inside surface of the chamber lid 221 is covered by the insulator 132 which was described above in regard to its function of insulating the gas distribution plate 122 from the chamber lid.

In our implementation, the upper and lower wall liners 234 and 236 each are composed of alumina about one inch (25 mm) thick, and the lid insulator 120 is about one inch thick. In contrast, the pedestal shield disc 34 is only about 0.040 inch (1 mm) thick. In addition, the shield disc is of very uniform thickness, and the pedestal top face is very smooth unanodized aluminum, so as to provide the lowest possible, and most spatially uniform, impedance between the pedestal and the water supported thereon. Therefore, the impedance between the pedestal and the plasma body is much less than the impedance between the chamber wall and the plasma body. This promotes efficiency and uniformity of deposition on the semiconductor wafer. (To minimize non-uniformity between the edge and center of the wafer, the gas distribution plate also is larger than the wafer diameter, preferably by about 20%).

FIG. 5 is a cross sectional diagram of a portion of the edge of the process chamber showing the exhaust plenum and exhaust port. In particular, the annular ceramic rings 236 and 234 are shown in more detail, with the plenum 222 formed partially in ring 234. As can be seen, ring 234 is attached to the lid assembly via a TEFLON® (polytetrafluoroethylene) screw 40. Ring 234 preferably only contacts chamber wall 134 at a few points to limit heat loss. Ring 236 simply sits on a shelf 251 of the process wall, and is aligned against a ring 42. An air gap between ring 236 and process wall 134 increases the dielectric value and is thus beneficial. An air gap between 1 and 25 millimeters is used, preferably a 10 millimeter gap is used.

Inside exhaust chamber 239, another ceramic liner 44 is used, and is held in place by a TEFLON® (polytetrafluoroethylene) screw 41 into the lid assembly on one side of window 230. Additional ceramic liners 46 and 48 cover the exhaust chamber down to the bottom of channel 239. Ceramic liners 44, 46 and 48, and the top portion of liner 234, are preferably aluminum oxide. The gas flows out into chamber 239 through exhaust port 226.

In exhaust port viewing window 230, preferably made of single crystal sapphire, allows viewing of any residue build-ing.

As can be seen, insulator 120 includes a beveled portion 50 which extends down below the level of face plate 122 in order to form a narrow gap between it and ceramic ring 234 for the passage of exhaust gases.

A series of O-rings provide good contact between various elements, including O-rings in slots 52, 54, and 56 on the lid assembly, and an O-ring slot 58 for the exhaust port assembly.

Figure 6:
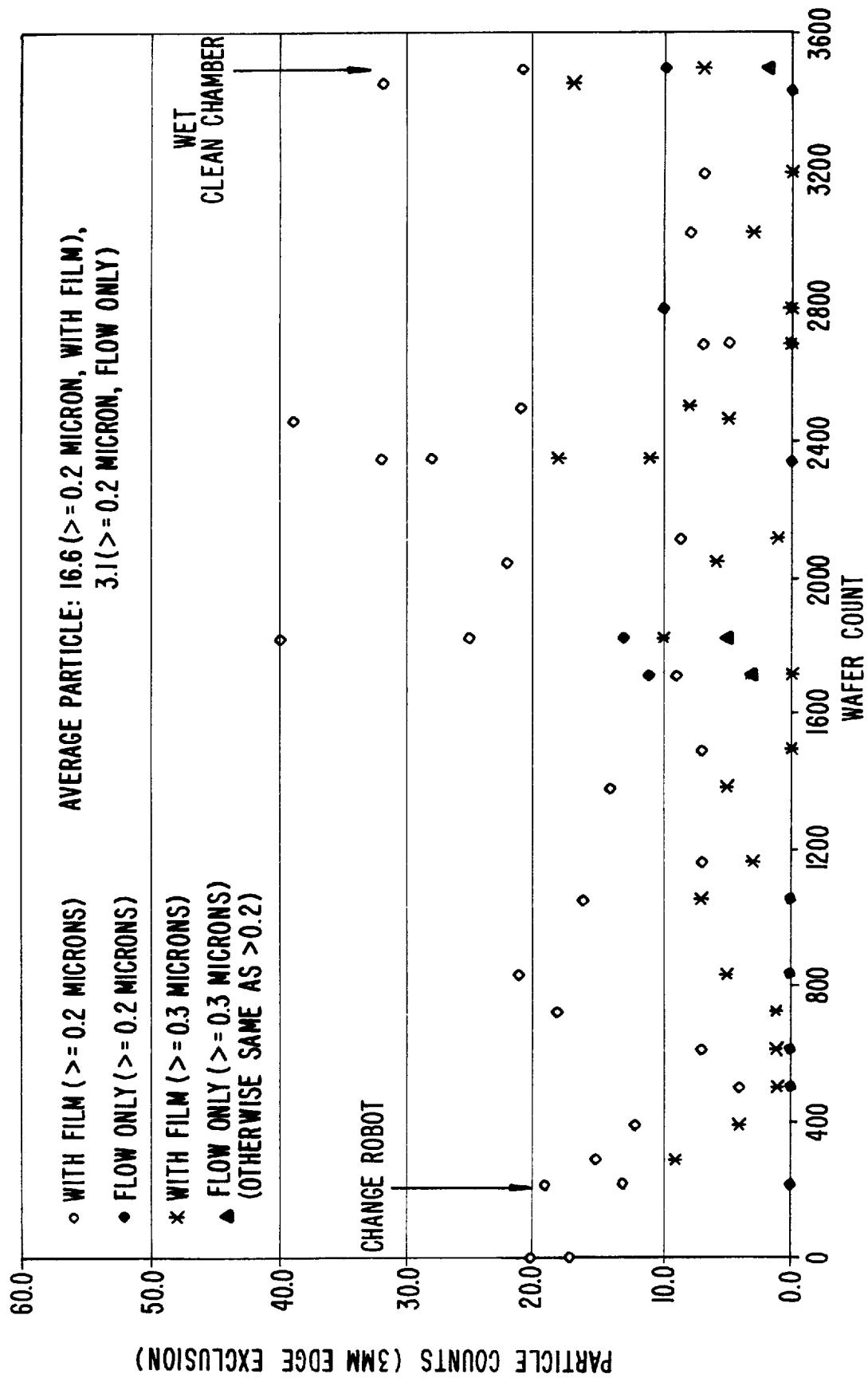
FIG. 6 is a diagram of particle counts versus number of wafers processed using the present invention.

The effectiveness of the ceramic liners in extending the number of wafers which can be run in between clean operations is shown in FIG. 6. FIG. 6 is a diagram of wafer runs showing particulate build-up after different numbers of wafer runs. As can be seen, the number of particles remains relatively constant, and the particle size is small. The invention enabled a run of 3600 wafers before doing a cleaning operation. The need for a clean is primarily determined by visual observation of residue build-up through viewing window 232.

The processing steps for doing a clean according to the present invention are different from a typical processing step. In the first instance, a fluorine cleaning operation is typically done after 3600 wafers, rather than 1000–2000 wafers in the prior art process. In addition, rather than a first step of activating heaters to heat the chamber walls, the cleaning step can be initiated immediately upon removal of the wafer in the last processing step, relying on the ceramic liners having retained sufficient heat. Preferably, the ceramic liner is at least 100° C., preferably between 120° C. and 170° C. Preferably, this period of time between the end of the process step and the start of a clean operation is no more than a few seconds. In all other aspects, the cleaning operation can proceed as set forth, for example, in the patents referenced in the background of this application.

As will be understood by those with skill in the art, the present invention can be embodied in other specific forms without departing from the spirit or essential characteristics thereof. For example, the rings could be of different shapes and could cover the chamber walls without producing the narrow slit for exhaust gas as in the preferred embodiment. Additionally, only ring 234 might be used, relying on purge gases to eliminate the need for ring 236. Alternately, a ceramic-coated susceptor could be used, changing the desired thickness of the ceramic liners. Accordingly, the preferred embodiments of the invention set forth herein are merely illustrative, and reference should be made to the following claims for setting forth the scope of the invention.

What is claimed is:

1. A processing apparatus, comprising:
    a processing chamber including a body with an upper surface, a lower surface and side surfaces extending from said lower surface, terminating proximate to said upper surface, spaced-apart therefrom defining an annular slot;
    a pedestal disposed in said processing chamber between said upper and lower surfaces, with said body further defining an exhaust outlet having an interior surface in fluid communication with said annular slot, with said annular slot positioned between said side surfaces and said exhaust outlet; and
    a ceramic body covering a portion of said interior surface.

2. The apparatus of claim 1 wherein said processing chamber is a chemical vapor deposition (CVD) chamber.

3. The apparatus of claim 1 further comprising:
    a gas distribution manifold disposed opposite to said pedestal; and
    a ceramic isolator ring surrounding said gas distribution manifold and extending below said gas distribution manifold.

4. The apparatus of claim 1 further comprising a ceramic layer positioned between said pedestal and said side surfaces and having a major surface, a first portion of which is in abutting relation with said side surfaces with a second portion being spaced apart therefrom, said second portion defining a gap.

5. The apparatus of claim 4 wherein said ceramic layer is attached to said processing chamber with an electrical insulating material.

6. The apparatus of claim 5 wherein said electrical insulating material is a plurality of polytetrafluoroethylene screws.

7. The apparatus of claim 1
    wherein said pedestal and said upper and side surfaces define a reaction region boundary, a portion of which, disposed proximate to said pedestal, has a greater dielectric constant than the remaining regions of said reaction region boundary.

8. The apparatus of claim 7 wherein said pedestal has a periphery and said portion is disposed about said periphery.

9. The apparatus of claim 7 wherein said portion and said remaining regions include a ceramic layer having a thickness, with the thickness of said ceramic layer of said remaining regions being greater than the thickness of said ceramic layer of said portion.

10. The apparatus of claim 7 wherein said portion includes a layer of a first material having a first dielectric constant associated therewith and said remaining regions include a layer of a second material, differing from said first material, having a second dielectric constant associated therewith.

11. A processing apparatus, comprising:
   a processing chamber including a body with an upper surface, a lower surface and side surfaces extending from said lower surface terminating proximate to said upper surface;
   a pedestal disposed in said processing chamber between said upper and lower surfaces,
   a ceramic layer positioned between said pedestal and said side surfaces and having a major surface a first portion of which is in abutting relation with said side surfaces with a second portion being spaced apart therefrom, said second portion defining a gap.

12. The processing apparatus of claim 11 wherein said gap is between 1 and 25 millimeters.

13. The processing apparatus of claim 11 wherein said gap is 10 millimeters.

14. The processing chamber of claim 11 wherein said first portion further comprises a plurality of bumps on an portion of ceramic layer adjacent walls of said processing chamber.

15. A processing apparatus, comprising:
   a processing chamber including a body with an upper surface, a lower surface and side surfaces extending from said lower surface terminating proximate to said upper surface; and
   a pedestal disposed in said processing chamber between said upper and lower surfaces, with said pedestal and said upper and side surfaces defining a reaction region boundary, a portion of which, disposed proximate to said pedestal, has a lower dielectric constant than the remaining regions of said reaction region boundary.

16. The processing apparatus of claim 15 further including a ceramic layer covering a portion of said boundary and a securing member attaching said ceramic layer to said reaction region boundary.

17. A plasma enhanced chemical vapor deposition processing apparatus, comprising:
   a processing chamber including a body with an upper surface, a lower surface and side surfaces extending from said lower surface, terminating proximate to said upper surface, spaced-apart therefrom defining an annular slot; and
   a pedestal disposed in said processing chamber between said upper and lower surfaces, with said body further defining an exhaust outlet having an interior surface in fluid communication with said annular slot; and,
   a first ceramic liner covering a portion of said side surfaces, said first ceramic liner having a major surface a first portion in abutting relation with said side surfaces and a second portion, spaced apart therefrom, said second portion defining a gap; and
   a second ceramic liner covering said interior surface.

18. The apparatus of claim 17 further including a securing member for attaching a ceramic liner to said processing chamber, said securing member being made of an electrically insulating material.

19. A method for operating a processing chamber including a body with an upper surface, a lower surface and side surfaces extending from said lower surface terminating proximate to said upper surface and a pedestal disposed within said processing chamber said method comprising steps of:
   positioning said pedestal a predetermined distance from said upper surface, with said pedestal and said upper and side surfaces defining a reaction region boundary;
   coupling, within said reaction region boundary, a plasma; and
   varying an electrical impedance between said side surfaces and said plasma to be greater than an electrical impedance between said pedestal and said plasma.

20. The method of claim 19 wherein said step of varying an electrical impedance includes covering a periphery of said pedestal and said side surfaces with a dielectric material, with a thickness of the dielectric material covering said side surfaces being greater than the a thickness of the dielectric material covering said periphery.

21. The method of claim 19 wherein said step of varying an electrical impedance includes covering a periphery of said pedestal with a first material having a first dielectric constant associated therewith and said side surfaces with a second dielectric material having a second dielectric constant associated therewith, with said first dielectric constant being greater than said second dielectric constant.

22. The method of claim 19 wherein a securing member further comprises a plurality of polytetrafluoroethylene screws.

* * * * *